United States Patent [19]
Kempf et al.

[11] Patent Number: 5,612,068
[45] Date of Patent: Mar. 18, 1997

[54] APPARATUS FOR THE TRANSFER OF SUBSTRATES

[75] Inventors: Stefan Kempf, Alzenau; Eggo Sichmann, Gelnhausen, both of Germany

[73] Assignee: Leybold Aktiengesellschaft, Hanau am Main, Germany

[21] Appl. No.: 350,684

[22] Filed: Dec. 7, 1994

[30] Foreign Application Priority Data

Mar. 14, 1994 [DE] Germany ............. 44 08 537.0
Mar. 19, 1994 [DE] Germany ............. 44 09 558.9

[51] Int. Cl.$^6$ ................................................. B29C 45/06
[52] U.S. Cl. ............. 425/574; 414/223; 425/576; 425/810
[58] Field of Search ............................. 425/574, 575, 425/576, 810; 414/222, 223

[56] References Cited

U.S. PATENT DOCUMENTS

| | | | |
|---|---|---|---|
| 4,457,659 | 7/1984 | Watanabe | 414/223 |
| 4,808,102 | 2/1989 | Braun | 414/222 |
| 4,820,106 | 4/1989 | Walde et al. | 414/217 |
| 4,969,790 | 11/1990 | Petz et al. | 414/217 |
| 5,085,312 | 2/1992 | Ribordy et al. | 198/463.4 |
| 5,232,505 | 8/1993 | Novak et al. | 118/712 |
| 5,368,466 | 11/1994 | Hehl | 414/222 |

FOREIGN PATENT DOCUMENTS 3631718  9/1988  Germany.

OTHER PUBLICATIONS

Hesse, Stefan: Atlas der Modernen Handhabungstechnik, Hoppenstedt Technik Tabellen Verlag 1991 p. 233.

Primary Examiner—Tim Heitbrink
Attorney, Agent, or Firm—Felfe & Lynch

[57] ABSTRACT

In an apparatus for the transfer of substrates (9) from an initial station (3) through several process stations (4 to 8) and back to this initial station (3), manipulators (10 to 14) having pivoting gripper arms (15 to 19) and carousel transfer systems (20,21) for the transfer of the substrates (9) are provided. One of the carousels (20) provided with substrate holders (22) cooperates both with a two-armed first manipulator (11) and with a two-armed second manipulator (10). The second manipulator (10) lifts several substrates (9) simultaneously from the first carousel (20) in one period of time and feeds them to the corresponding second process station (5) which is configured for the simultaneous processing of several substrates. The second manipulator (11), in the same period of time, lifts one substrate (9) at a time from the first carousel (20) in several swings of its two gripper arms (16,16') and feeds them to the first process station (4) for the processing of one substrate at a time and carries them back from this process station (4) onto the first carousel (20). Two injection molding machines can be associated with the first carousel (20) and can feed the substrates directly through an additional manipulator.

15 Claims, 2 Drawing Sheets

APPARATUS FOR THE TRANSFER OF SUBSTRATES

BACKGROUND OF THE INVENTION

The invention relates to an apparatus for the transfer of substrates from an initial station configured as a carousel transfer system, through a plurality of process stations, and back to this initial station. The process stations perform the operations, e.g., coating, lacquering, drying, cooling, testing and sorting of the substrates, and manipulators with rotating gripper arms and carousel transfer systems permit the transfer of the substrates from station to station.

U.S. Pat. No. 5,232,505 discloses an apparatus for the automatic molding, coating, lacquering, testing and sorting of workpieces—especially flat, disk-shaped plastic substrates, such as optical or magneto-optical computer data diskettes—having at least one transfer system carrying the substrates from a station at which they are produced, such as an injection molding machine, to the process stations, and having a receiving station for the separate depositing of workpieces finished and tested perfect, and workpieces found defective. The substrate transfer system has carriages moving back and forth along a straight line and with three transfer arms with substrate holders disposed on both sides of the carriage. A vacuum coating apparatus is provided on the one side of the carriage and a stacking system is disposed on the other side of the carriage, with at least one receiver each for substrates found good and for rejected substrates. A carousel transfer system is disposed opposite the injection molding machine in the direction of movement of the carriage, including a turntable with lacquering, drying, printing, image inspection and centering systems. The turntable moves the substrates in a plurality of transport steps—preferably in nineteen transport steps—on a circular path by a full 360 degrees about the vertical axis of rotation of the turntable. The carriage, as it moves in the one direction transfers with its first arm a first substrate in a single step from the pickup station of the dispensing station to the airlock leading into and out of the vacuum coating apparatus and likewise simultaneously with the transport arm shifts a second substrate from the coating station to a lacquering station and likewise a third substrate from the lacquering station to the turntable which rotates step-wise and at the same pace. The carriage in its final movement carries a finished workpiece to the testing apparatus and an already tested workpiece from there to the second receiver.

This known apparatus has the disadvantage that its speed of operation and its operating cycles are determined by the slowest-working process station—the lacquering station—so that the output of the entire apparatus remains limited.

SUMMARY OF THE INVENTION

So the present invention is addressed to avoiding the disadvantages of the known apparatus, and furthermore can be supplied and operated from a single work station. The apparatus is furthermore to be connected directly with production stations—with injection molding machines, for example—and lastly also it is to permit servicing the individual process stations without the need to shut down the entire plant.

According to the invention, one of the carousels cooperates both with a first manipulator having two arms, each arm having a gripper for delivering a substrate to a first process station, and with a second manipulator having two arms, each having several grippers. The second manipulator lifts several substrates from the first carousel simultaneously in one period of time and carries them to the corresponding second process station which is configured for the simultaneous processing of several substrates. The first manipulator in the same period of time lifts one substrate at a time from the first carousel in several turning movements of both of its gripper arms and carries it to the first process station which is configured for the processing of one substrate at a time, and carries it back from this process station onto the first carousel.

In a preferred embodiment, an additional one-armed manipulator cooperates with the first carousel, its one arm having a plurality of grippers which transfer several substrates from a loading carousel adjacent to the first carousel. The substrates from two production stations, preferably injection molding machines equipped with one-armed manipulators, are fed to the loading carousel. Lastly, the first carousel can cooperate with a feed carousel by means of a feed manipulator having one arm which feeds substrates to the said first carousel for the purpose of finishing operations.

DETAILED DESCRIPTION OF THE PREFERRED EMBODIMENTS

Figure 1:
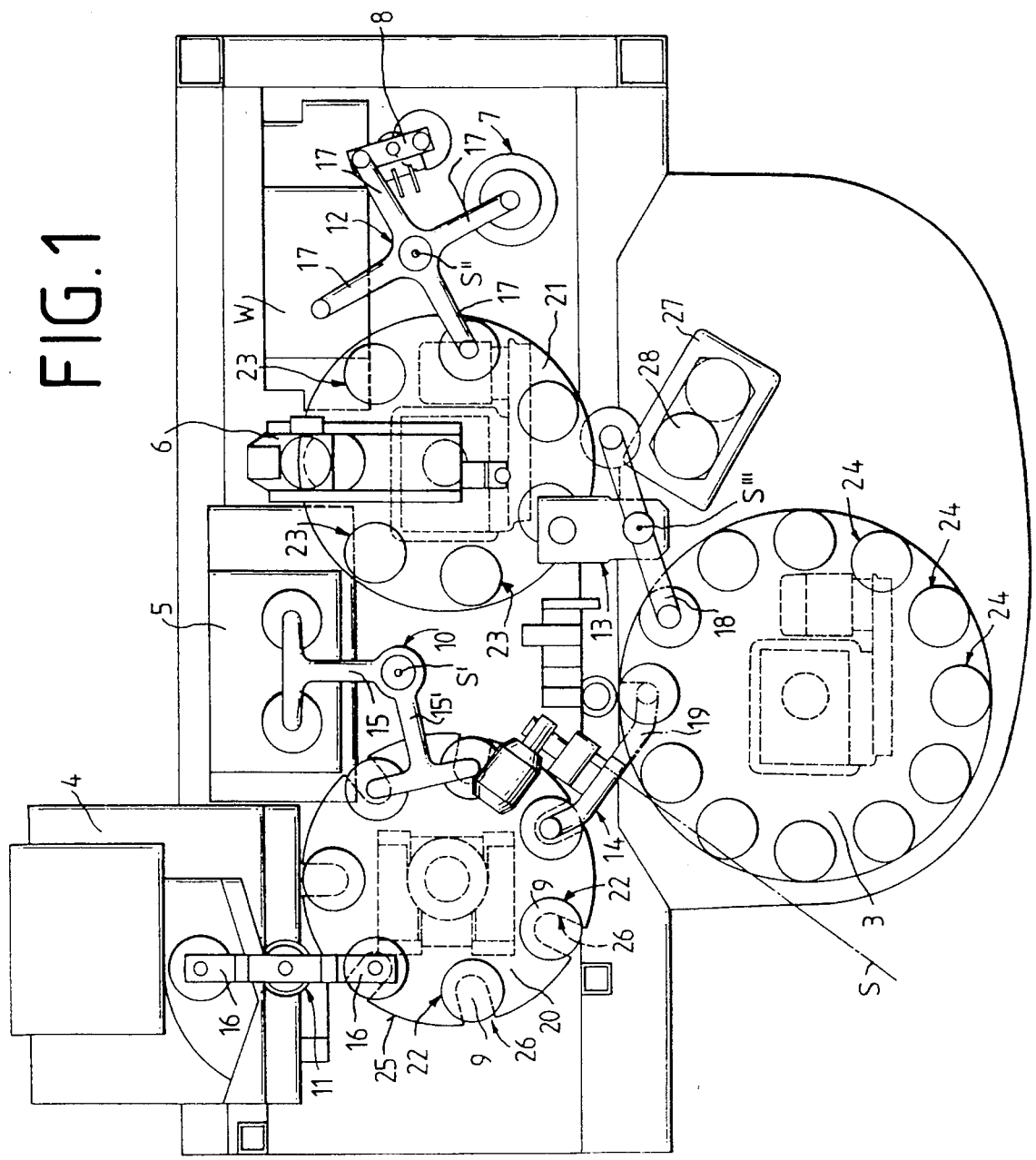
FIG. 1 is a plan view showing a first carousel adjacent to the second carousel.

Referring to FIG. 1, substrates 9 in the form of injection molded plastic disks are placed onto the feed carousel 3 which forms the initial station and transferred step-by-step clockwise into the reach of the arm 19 of the feed manipulator 14. Manipulator 14 reaches down and clutches a substrate 9, lifts it away from the substrate holder 24, and transports the substrate in a swinging movement around the horizontal axis of rotation S of the manipulator 14 to the first carousel 20, and lays the substrate 9 on a corresponding substrate holder 22. The carousel 20 transports the substrate step-wise into the reach of the gripper arms 16 of the first manipulator 11, each transport step corresponding to an angular movement of about 51.4 degrees, while the angular movement of each step of the carousel 3 amounts to 30 degrees. The gripper arm of the manipulator 11 lays the substrate down at the entry/exit opening of the airlock of the coating station 4 (first process station) from which the substrate 9 is transferred into the process chamber of the coating station 4. Such a transfer is described, for example, in U.S. Pat. No. 4,820,106. Since the cycle period of the coating apparatus is comparatively very short, the gripper arm 16 of the manipulator 11 clutches the already coated substrate 9 lying ready at the airlock, in the same moment in which the other gripper arm 16 clutches a substrate 9 from the first carousel 20. At the moment when the substrate 9 transferred from the first carousel 20 to the first process station 4 is laid down, the substrate 9 advancing in the opposite direction is set down on the first carousel. As soon as the first manipulator 11 has deposited a total of two substrates 9 successively on the first carousel 20, the second manipulator 10 goes into action whereby its one arm 15' simultaneously picks up two substrates 9 and transfers them to the second process station 5 and deposits them there. This second process station 5 is a lacquering system which is so designed that it lacquers two substrates 9 simultaneously, the time required for a lacquering operation being twice as long as the sputter coating process in process station 4.

While the gripper arm 15' is moving clockwise, the gripper arm 15 simultaneously transfers two substrates to the third carousel 21 and places them thereon. Carousel 21 rotates clockwise in the same cycle as the first carousel 20 and moves the substrates one by one to the third process station 6, which dries substrates 9 after lacquering. The third manipulator 12 equipped with four gripper arms 17 operates at the same rhythm as the first manipulator 11 and shifts one substrate 9 counterclockwise in the first step from the second carousel 21 to the fourth process station 7 which subjects the substrates to a quality test. Then, in a second step, a substrate is shifted from the fourth process station 7 to a fifth process station 8 of a substrate cooling system, and then in a third step from the fifth process station 8 to a waiting position W, and in a fourth step back to the second carousel 21 where the substrate 9 is deposited, in order then to be transported clockwise from second carousel 21 into the reach of the stacking manipulator 13. The stacking manipulator 13 is equipped with a gripper arm 18, the vertical axis of rotation S''' of manipulator 13 being at the same distance from the next two substrate carriers 24 of the feed carousel 3, and also the same distance from the substrate stack 28 of the stacking station 27 for defective substrates, and lastly the same distance from the next substrate holder 23 of the second carousel 21. The stacking manipulator 13 is thus in a position to transfer one substrate 9 from the second carousel 21 to the stacking station 27 or from the latter to the second feed carousel 3, and there to deposit the substrates on one of two substrate holders 24.

It is to be noted also that the feed manipulator 14 equipped with a horizontal axis of rotation S turns the substrate 9 lying on the feed carousel 3 over so that the gripper arm 19 can descend through the plane of the substrate holders 22, and for this reason the rotating feed carousel 3 is provided on its radially external area with cutouts 26.

An important advantage of the described apparatus is that the serving of the system, i.e., supplying it with untreated substrates 9, and stacking the untreated substrates, is performed within the range of initial station 3, i.e., the apparatus needs to be freely accessible during operation only at this section. Another advantage is the continuous, especially rapid and uniform flow and transport of the substrates, the apparatus being laid out and coordinated so that the quickest treatment step determines the rate of flow of the substrates.

Figure 2:
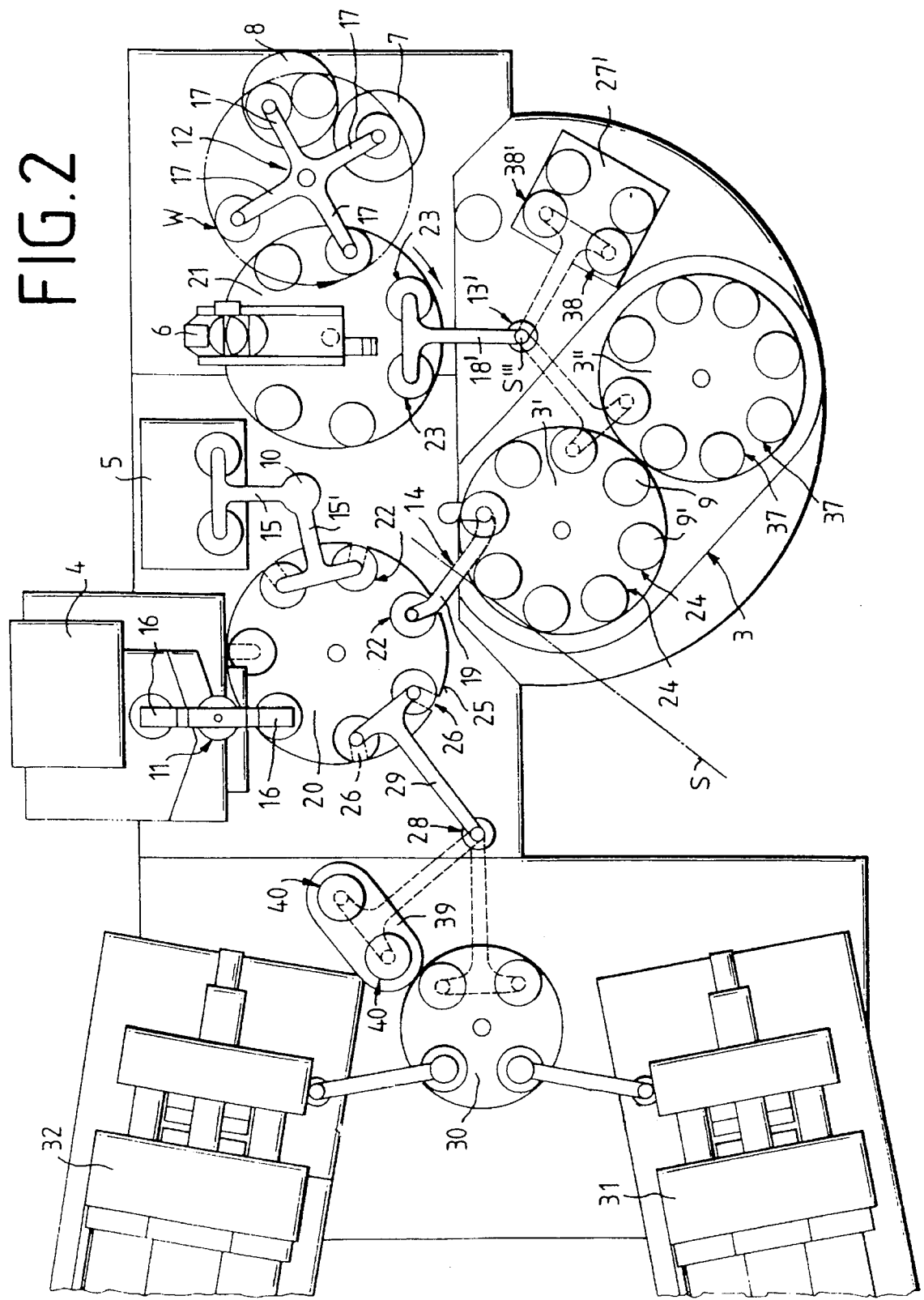
FIG. 2 is a plan view showing injection molding machines and a loading carousel adjacent to the second carousel.

To be able to connect an apparatus of the type described in FIG. 1 directly to producing stations, e.g., to injection molding machines 31 and 32 (see FIG. 2), the more slowly operating injection molding machines 31 and 32 are connected to the first carousel 20 by a common loading carousel 30 and an additional one-armed manipulator 28, while third manipulator 14 is turned off. In the event of trouble in the injection molding machines 31 and 32, the substrate processing can be continued; in this case the manipulator 14 needs to be turned on and the substrate holders 24 must be supplied with substrates 9 for processing.

Lastly, in the space between the loading carousel 30 and the first carousel 20, a parking or stacking station 39 is provided, which makes it possible to let the injection molding machines 31 and 32 continue to run in the event of maintenance work on the process stations, in which case the substrates 40 produced by the two machines 31 and 32 are transferred by the gripper arm 29 only as far as station 39, where they are stacked.

Another difference from the apparatus of FIG. 1 is that the gripper arm 18' of manipulator 13' is equipped with two substrate holders and the stacking station 27' has a total of four substrate receivers 38, 38'. Lastly, the initial station includes two carousels 3' and 3", so that the gripper arm 18' can deposit two substrates simultaneously, either both on holders 24 of carousel 3' or both on holders 37 of carousel 3", or the one substrate on a holder and the other substrate on a holder 37. This arrangement makes it possible to process substrates having two different information patterns, e.g. a Beethoven CD originating in the injection molding machine 31 and a Mozart CD originating in the injection molding machine 32.

We claim:

1. Apparatus for transporting substrates through a plurality of process stations, said apparatus comprising
    a first carousel having a plurality of substrate holders,
    a first process station configured to process one substrate at a time,
    a first manipulator having two opposed arms, each arm in a period of time carrying a plurality of substrates one at a time from one of said carousel and said first process station to the other of said carousel and said first process station,
    a second process station configured to simultaneously process a plurality of substrates, and
    a second manipulator having a first arm which in said period of time carries a plurality of substrates simultaneously from said first carousel to said second process station.

2. Apparatus as in claim 1, wherein said first carousel has a peripheral cutout below each substrate holder, said apparatus further comprising
    a feed carousel having a plurality of substrate holders, and
    a feed manipulator having a single arm which is pivotable about a horizontal axis, said arm in said period of time carrying a plurality of substrates one at a time from said feed carousel to said first carousel, said arm of said feed manipulator passing through a respective cutout on said first carousel.

3. Apparatus as in claim 1 further comprising a second carousel, said second manipulator having a second arm which in said period of time carries a plurality of substrates simultaneously from said second process station to said second carousel.

4. Apparatus as in claim 3 further comprising a third process station adjacent to said second carousel, a fourth process station adjacent to said second carousel, and
    a third manipulator having an arm which in said period of time carries a plurality of substrates one at a time from said second carousel to said fourth process station.

5. Apparatus as in claim 3 further comprising
    feed carousel means adjacent said first carousel,
    a feed manipulator for transferring substrates from said feed carousel means to said first carousel,
    a stacking station between said second carousel and said feed carousel means,
    a stacking manipulator which in said period of time carries a plurality of substrates to at least one of said stacking station and said feed carousel means.

6. Apparatus as in claim 5 wherein said stacking manipulator in said period of time carries a plurality of substrates one at a time to at least one of said collecting station and said feed carousel means.

7. Apparatus as in claim 6 wherein said first and stacking manipulators each perform two stepwise rotational movements for each stepwise rotational movement of said second manipulator.

8. Apparatus as in claim 5 wherein said stacking manipulator in said period of time carries a plurality of substrates simultaneously to at least one of said stacking station and said feed carousel means.

9. Apparatus as in claim 8 wherein said first manipulator performs two stepwise rotational movements for each stepwise rotational movement of said stacking manipulator.

10. Apparatus as in claim 8 wherein said feed carousel means comprises a pair of first carousels, said stacking manipulator being able to simultaneously carry a substrate to each feed carousel.

11. Apparatus as in claim 1 wherein said first manipulator carries two substrates one at a time from said first process station to said first carousel, while said second manipulator carries two substrates simultaneously, said first carousel performing two stepwise movements during said period of time.

12. Apparatus as in claim 1 further comprising
at least one production station,
a loading carousel adjacent to said production station,
at least one production manipulator for transferring a substrate from each said at least one production station to said loading carousel,
a loading manipulator for transferring substrates from said loading carousel to said first carousel.

13. Apparatus as in claim 12 wherein said at least one production station is an injection molding machine.

14. Apparatus as in claim 12 wherein there are two said production stations and two said production manipulators, each production manipulator delivering a single substrate to said loading carousel in said period of time, said loading manipulator transporting two said substrates from said loading carousel to said first carousel simultaneously.

15. Apparatus as in claim 12 further comprising a parking station situated between said loading carousel and said first carousel, said station having at least one substrate holder which can be loaded by said loading manipulator prior to transfer to said first carousel.

* * * * *